(12) United States Patent
Zheng et al.

(10) Patent No.: US 12,567,724 B2
(45) Date of Patent: Mar. 3, 2026

(54) SEMICONDUCTOR LASER COMPONENTS

(71) Applicant: ANHUI GAN SEMICONDUCTOR CO., LTD., Lu'an (CN)

(72) Inventors: Jinjian Zheng, Lu'an (CN); Shuiqing Li, Lu'an (CN); Feilin Xun, Lu'an (CN); Heqing Deng, Lu'an (CN); Jiangyong Zhang, Lu'an (CN); Xin Cai, Lu'an (CN); Xiaoqin Li, Lu'an (CN); Jiabin Lan, Lu'an (CN); Zihan Liu, Lu'an (CN); Huikang Zhang, Lu'an (CN); Jun Huang, Lu'an (CN)

(73) Assignee: ANHUI GAN SEMICONDUCTOR CO., LTD., Lu'an (CN)

( * ) Notice: Subject to any disclaimer, the term of this patent is extended or adjusted under 35 U.S.C. 154(b) by 0 days.

(21) Appl. No.: 18/803,450

(22) Filed: Aug. 13, 2024

(65) Prior Publication Data

US 2025/0372955 A1 Dec. 4, 2025

Related U.S. Application Data

(63) Continuation of application No. PCT/CN2024/096245, filed on May 30, 2024.

(51) Int. Cl.
*H01S 5/20* (2006.01)
*H01S 5/34* (2006.01)

(52) U.S. Cl.
CPC .......... *H01S 5/2054* (2013.01); *H01S 5/2009* (2013.01); *H01S 5/3407* (2013.01)

(58) Field of Classification Search
None
See application file for complete search history.

(56) References Cited

U.S. PATENT DOCUMENTS 6,028,877 A * 2/2000 Kimura ............... H01S 5/32341
372/45.01
6,031,858 A * 2/2000 Hatakoshi ........... H01S 5/32341
372/45.01

(Continued)

FOREIGN PATENT DOCUMENTS

CN 104659171 B * 12/2018
CN 109742151 A 5/2019

(Continued)

OTHER PUBLICATIONS

International Search Report in PCT/CN2024/096245 mailed on Dec. 23, 2024, 8 pages.

(Continued)

*Primary Examiner* — Tod T Van Roy
(74) *Attorney, Agent, or Firm* — PORUS IP LLC

(57) ABSTRACT

Embodiments of the present disclosure provide a semiconductor laser component, comprising, from bottom to top, a substrate, a lower limiting layer, a lower waveguide layer, an active layer, an upper waveguide layer, an electron blocking layer, and an upper limiting layer. The active layer satisfies at least one of that a content ratio of an element Al to an element H satisfies a first preset proportion distribution, a content ratio of an element In to the element H satisfies a second preset proportion distribution, a content ratio of an element Si to the element H satisfies a third preset proportion distribution, a content ratio of an element Mg to the element H satisfies a fourth preset proportion distribution, and a content ratio of an element C to an element O satisfies a fifth preset proportion distribution.

6 Claims, 10 Drawing Sheets

(56) References Cited

U.S. PATENT DOCUMENTS

| | | | | |
|---|---|---|---|---|
| 7,701,992 | B2 * | 4/2010 | Choi | H01S 5/22 |
| | | | | 372/45.01 |
| 10,680,414 | B2 * | 6/2020 | Takayama | H01S 5/34333 |
| 11,830,963 | B2 * | 11/2023 | Jain | H10H 20/8215 |
| 2025/0047074 | A1 * | 2/2025 | Wang | H01S 5/2031 |
| 2025/0141190 | A1 * | 5/2025 | Zheng | H01S 5/3216 |
| 2025/0141191 | A1 * | 5/2025 | Zheng | H01S 5/34346 |
| 2025/0143016 | A1 * | 5/2025 | Li | H10H 20/812 |

FOREIGN PATENT DOCUMENTS

| | | | |
|---|---|---|---|
| CN | 111029448 | | 4/2020 |
| CN | 117317798 | A | 12/2023 |
| CN | 117458263 | A | 1/2024 |
| CN | 117543337 | | 2/2024 |
| CN | 117543337 | A * | 2/2024 |
| CN | 117712832 | A | 3/2024 |
| CN | 117791308 | | 3/2024 |
| CN | 117954965 | A * | 4/2024 |
| CN | 118054303 | A * | 5/2024 |
| CN | 118099943 | A | 5/2024 |
| CN | 118099944 | A * | 5/2024 |
| JP | 2014003329 | A * | 1/2014 |

OTHER PUBLICATIONS

Written Opinion in PCT/CN2024/096245 mailed on Dec. 23, 2024, 12 pages.

* cited by examiner

1

SEMICONDUCTOR LASER COMPONENTS

CROSS-REFERENCE TO RELATED APPLICATIONS

This application is a Continuation of International Application No. PCT/CN2024/096245, filed on May 30, 2024, the entire contents of which are hereby incorporated by reference.

TECHNICAL FIELD

The present disclosure relates to the technical field of semiconductor photoelectric devices, and in particular to a semiconductor laser component.

BACKGROUND

A laser device is widely used in the fields of laser display, laser TVs, laser projectors, communication, medical, weapons, guidance, ranging, spectral analysis, cutting, precision welding, high-density optical storage, or the like. There are many types of laser devices classified in various ways, mainly including solid, gas, liquid, semiconductor, and dye types of laser devices. Compared with other types of laser devices, an all-solid-state semiconductor laser device has the advantages of small size, high efficiency, light weight, good stability, long service life, simple and compact structure, miniaturization, etc.

In addition, major differences between the laser device and the nitride semiconductor LED are illustrated as follows.

(1) A laser of the laser device is generated by carriers undergoing excited radiation, a spectral full width at half maximum (FWHM) is small, a brightness is very high, and an output power of a single laser may be in a W level. However, light of the nitride semiconductor LED is generated by spontaneous radiation, and an output power of a single semiconductor laser is in an mW level.

(2) A usage current density of the laser device reaches $KA/cm^2$, which is two orders of magnitude higher than that of the nitride semiconductor LED, thus causing stronger electron leakage, more severe Auger recombination, a stronger polarization effect, and a more severe electron-hole mismatch, which leads to a more severe Droop effect in efficiency.

(3) The LED has spontaneous transition radiation from high-energy-level incoherent light to low-energy-level incoherent light without external action. However, the laser device is implemented by excited transition radiation, the induced photon energy is equal to a difference between the energy levels of the electron transition, resulting in identical coherent light of photons and induced photons.

(4) The principle is different. The LED is that under the action of an external voltage, electron holes jump to an active layer or a p-n junction to produce radiative recombination light. However, the laser device needs to meet the condition of excitation of an inversion distribution in an active region carrier before being excited. The excited radiation light oscillates back and forth in a resonant cavity to realize light amplification by propagating in a gain medium, so that a threshold condition is met, the gain is greater than the loss, and the laser light is ultimately output.

At present, electrode injection near an output end face on an upper surface of a ridge waveguide of a nitride semiconductor UV laser (e.g., a gallium nitride laser) produces heat generation at an emergent end and generates stray and leakage light that interferes with a far-field front-focal plane (FFP) image.

Therefore, it is desirable to provide a semiconductor laser component capable of reducing heat generation at the emergent end, and minimizing the stray and leakage light, thereby improving the quality of the far-field FFP image.

SUMMARY

One or more embodiments of the present disclosure provide a semiconductor laser component. The semiconductor laser component may comprise, from bottom to top, a substrate, a lower limiting layer, a lower waveguide layer, an active layer, an upper waveguide layer, an electron blocking layer, and an upper limiting layer. The active layer satisfies at least one of that a content ratio of an element Al to an element H satisfies a first preset proportion distribution, a content ratio of an element In to the element H satisfies a second preset proportion distribution, a content ratio of an element Si to the element H satisfies a third preset proportion distribution, a content ratio of an element Mg to the element H satisfies a fourth preset proportion distribution, and a content ratio of an element C to an element O satisfies a fifth preset proportion distribution.

BRIEF DESCRIPTION OF THE DRAWINGS

The present disclosure will be further illustrated by way of exemplary embodiments, which will be described in detail by means of the accompanying drawings. These embodiments are not limiting. In these embodiments, the same numbering indicates the same structure, wherein.

Figure 1:
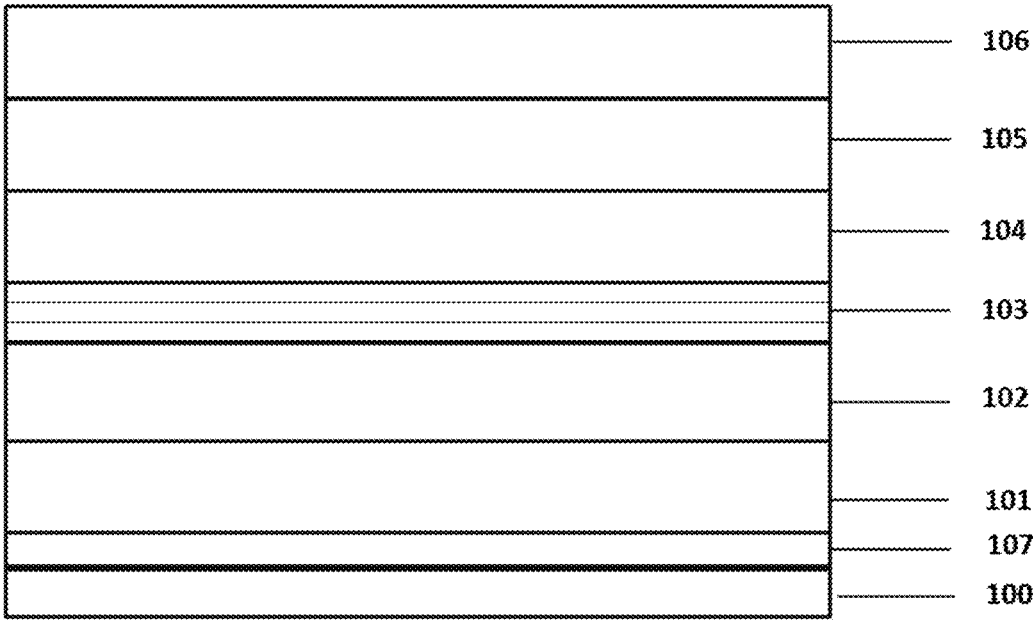
FIG. 1 is a schematic structural diagram illustrating an exemplary semiconductor laser component according to some embodiments of the present disclosure.

Reference signs: 100: substrate; 101: lower limiting layer; 102: lower waveguide layer; 103: active layer; 104: upper waveguide layer; 105: electron blocking layer; 106: upper limiting layer; 107: current expansion layer.

DETAILED DESCRIPTION

In order to more clearly illustrate the technical solutions of the embodiments of the present disclosure, the following briefly introduces the drawings that need to be used in the description of the embodiments. Apparently, the accompanying drawings in the following description are only some examples or embodiments of the present disclosure, and those skilled in the art can also apply the present disclosure to other similar scenarios according to the drawings without creative efforts. Unless obviously obtained from the context or the context illustrates otherwise, the same numeral in the drawings refers to the same structure or operation.

It should be understood that "system", "device", "unit" and/or "module" as used herein is a method for distinguishing different components, elements, parts, portions or assemblies of different levels. However, the words may be replaced by other expressions if other words can achieve the same purpose.

As indicated in the disclosure and claims, the terms "a", "an", and/or "the" are not specific to the singular form and may include the plural form unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

FIG. 1 is a schematic structural diagram illustrating an exemplary semiconductor laser component according to some embodiments of the present disclosure.

Figure 7:
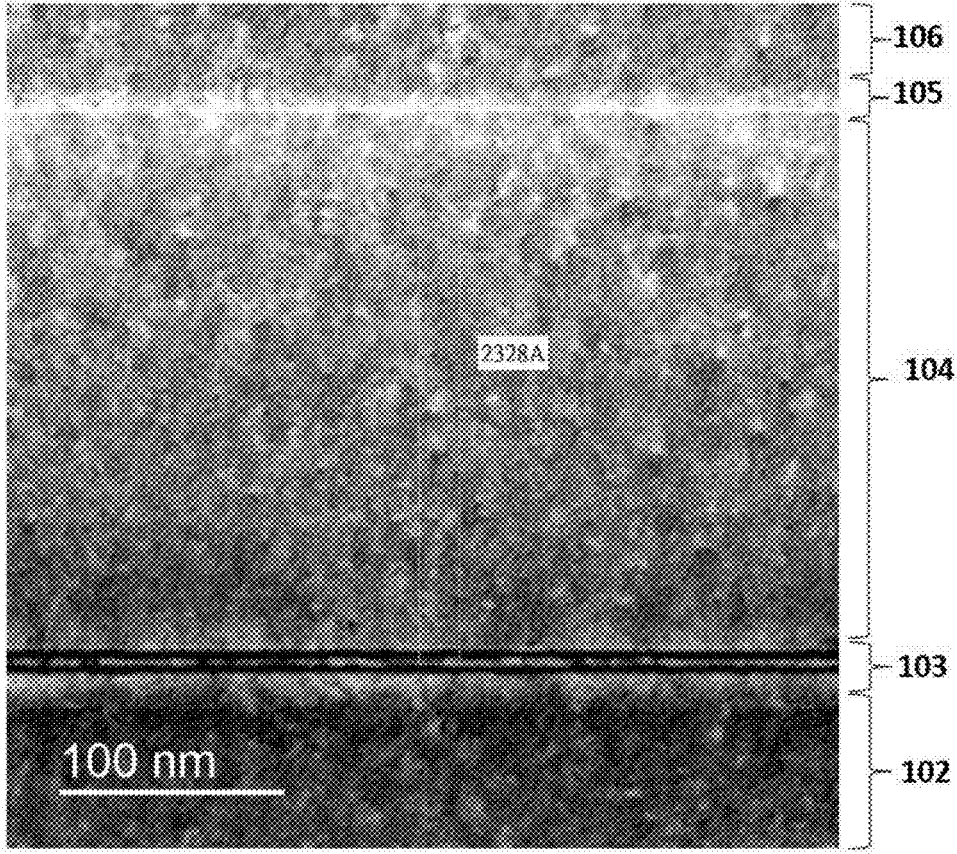
FIG. 7 is a partially enlarged view of a TEM diagram illustrating an exemplary semiconductor laser component when a size of a TEM is 100 nm according to some embodiments of the present disclosure.

FIG. 7 illustrates an upper limiting layer 106 in a partially enlarged view of a TEM diagram illustrating an exemplary semiconductor laser component when a size of a TEM is 100 nm.

Figure 8:
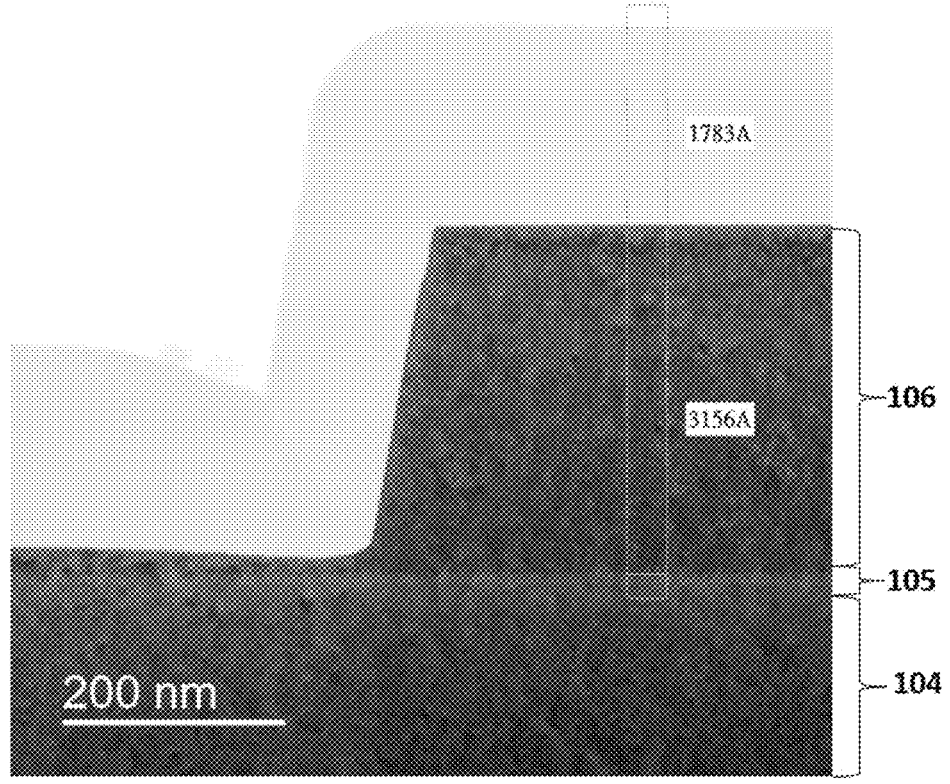
FIG. 8 is a partially enlarged view of a TEM diagram illustrating an exemplary semiconductor laser component when a size of a TEM is 200 nm according to some embodiments of the present disclosure.

FIG. 8 illustrates an upper limiting layer 106 in a partially enlarged view of a TEM diagram illustrating an exemplary semiconductor laser component when a size of a TEM is 200 nm.

In some embodiments, the semiconductor laser component may comprise, from bottom to top, a substrate 100, a lower limiting layer 101, a lower waveguide layer 102, an active layer 103, an upper waveguide layer 104, an electron blocking layer 105, and the upper limiting layer 106. The active layer may satisfy at least one of that a content ratio of an element Al to an element H satisfies a first preset proportion distribution, a content ratio of an element In to the element H satisfies a second preset proportion distribution, a content ratio of an element Si to the element H satisfies a third preset proportion distribution, a content ratio of an element Mg to the element H satisfies a fourth preset proportion distribution, and a content ratio of an element C to an element O satisfies a fifth preset proportion distribution.

The substrate 100 refers to a material substrate used to fabricate the semiconductor laser component. For example, the substrate may be a wafer fabricated from a semiconductor single crystal material.

In some embodiments, the substrate may include any one of a sapphire composite substrate, a silicon composite substrate, a Ge composite substrate, a SiC composite substrate, an AlN composite substrate, a GaN composite substrate, a GaAs composite substrate, an InP composite substrate, an InAs composite substrate, a GaSb composite substrate, a sapphire/$SiO_2$ composite substrate, a Mo composite substrate, TiW composite substrate, a CuW composite substrate, a Cu composite substrate, a sapphire/AlN composite substrate, a diamond composite substrate, a graphene composite substrate, a sapphire/SiNx composite substrate, a sapphire/$SiO_2$/SiNx composite substrate, a sapphire/SiNx/$SiO_2$ composite substrate, a Mg—Al spinel composite substrate, a $MgAl_2O_4$ composite substrate, a MgO composite substrate, a ZnO composite substrate, a $ZrB_2$ and $LiAlO_2$ composite substrate, and a $LiGaO_2$ composite substrate.

Figure 4:
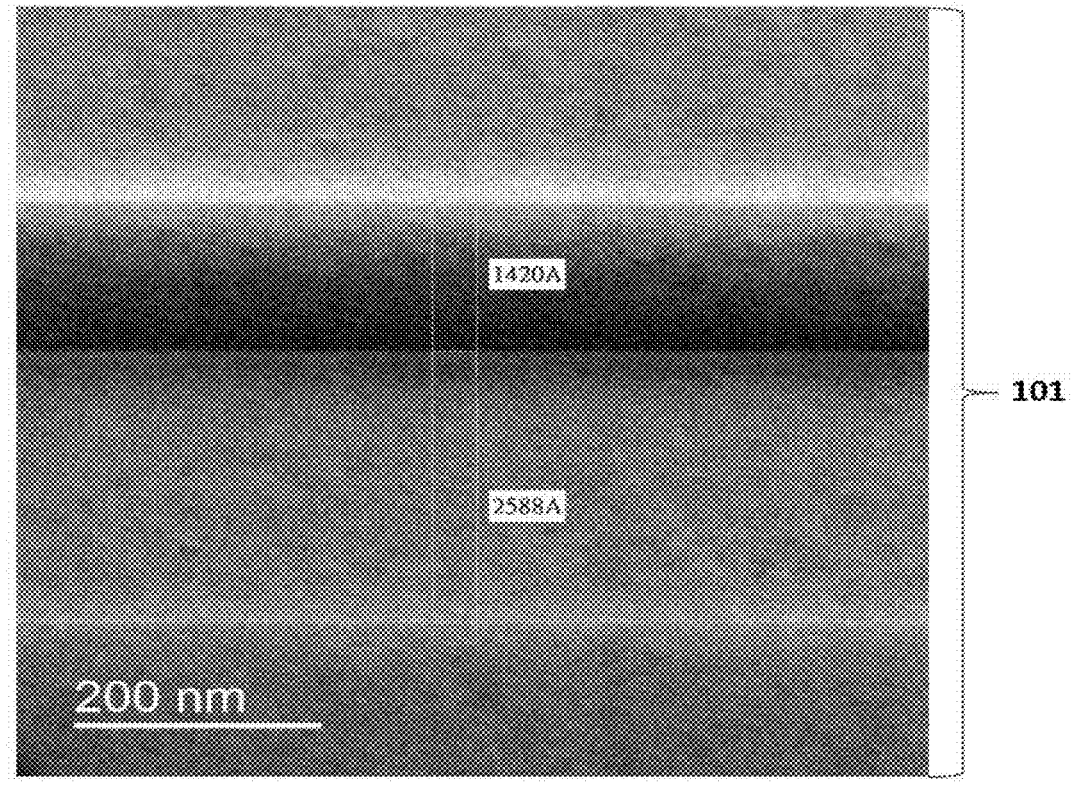
FIG. 4 is a partially enlarged view of a transmission electron microscope (TEM) diagram illustrating an exemplary semiconductor laser component when a size of a TEM is 200 nm according to some embodiments of the present disclosure.

FIG. 4 is a partially enlarged view of a TEM diagram illustrating an exemplary semiconductor laser component when a size of a TEM is 200 nm according to some embodiments of the present disclosure.

The lower limiting layer 101 may be configured to regulate a carrier distribution and a stress distribution of the active layer 103, and reduce heat accumulation in the active layer 103. For example, as the lower limiting layer 101 shown in FIG. 4, 1420 Å and 2588 Å in FIG. 4 denote thicknesses of rectangular boxes corresponding to the lower limiting layer 101. The unit for the thickness represented by Å is angstroms. The thicknesses refer to actual measured thicknesses. Each of the rectangular boxes may correspond to a shaded region.

Figure 5:
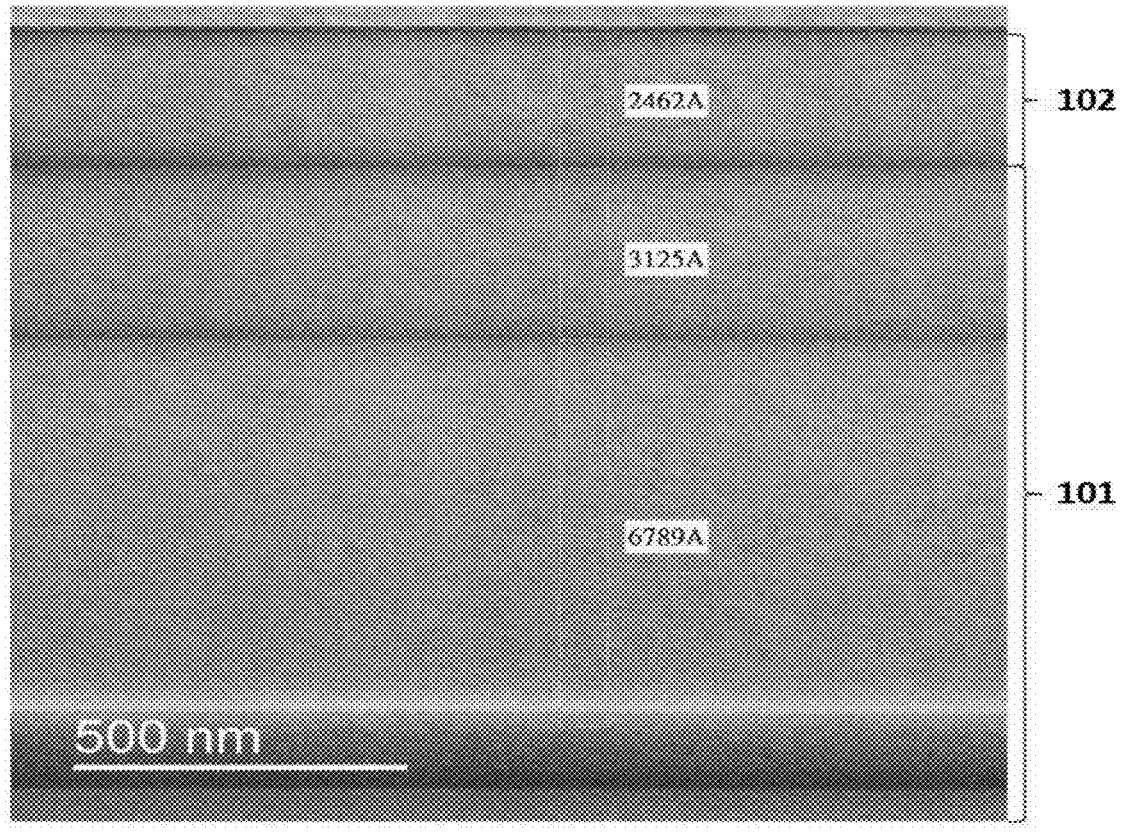
FIG. 5 is a partially enlarged view of a TEM diagram illustrating an exemplary semiconductor laser component when a size of a TEM is 500 nm according to some embodiments of the present disclosure.

FIG. 5 is a partially enlarged view of a TEM diagram illustrating an exemplary semiconductor laser component when a size of a TEM is 500 nm according to some embodiments of the present disclosure.

The lower waveguide layer 102 may serve as an optical transmission channel of the semiconductor laser component. For example, as the lower waveguide layer 102 shown in FIG. 5, 6789 Å represents a thickness of a rectangular box corresponding to the lower waveguide layer 102, and 3125 Å and 2486 Å represents thicknesses of rectangular boxes corresponding to the lower limiting layer 101. The thicknesses refer to actual measured thicknesses. Each of the rectangular boxs may correspond to a shaded region.

The active layer 103 refers to a thin layer used to generate photons and amplify light.

In some embodiments, the active layer may include at least one of GaN, InGaN, InN, AlInN, AlGaN, AlInGaN, AlN, GaAs, GaP, InP, AlGaAs, AlInGaAs, AlGaInP, InGaAs, InGaAsN, AlInAs, AlInP, AlGaP, InGaP, GaSb, InSb, InAs, InAsSb, AlGaSb, AlSb, InGaSb, AlGaAsSb, InGaAsSb, SiC, $Ga_2O_3$, BN, and diamond.

In some embodiments, a thickness of the active layer may be within a range of 10 Å-100 Å. For example, the thickness of the active layer may be 10 Å. As another example, the thickness of the active layer may be 55 Å. As another example, the thickness of the active layer may be 100 Å.

Figure 6:
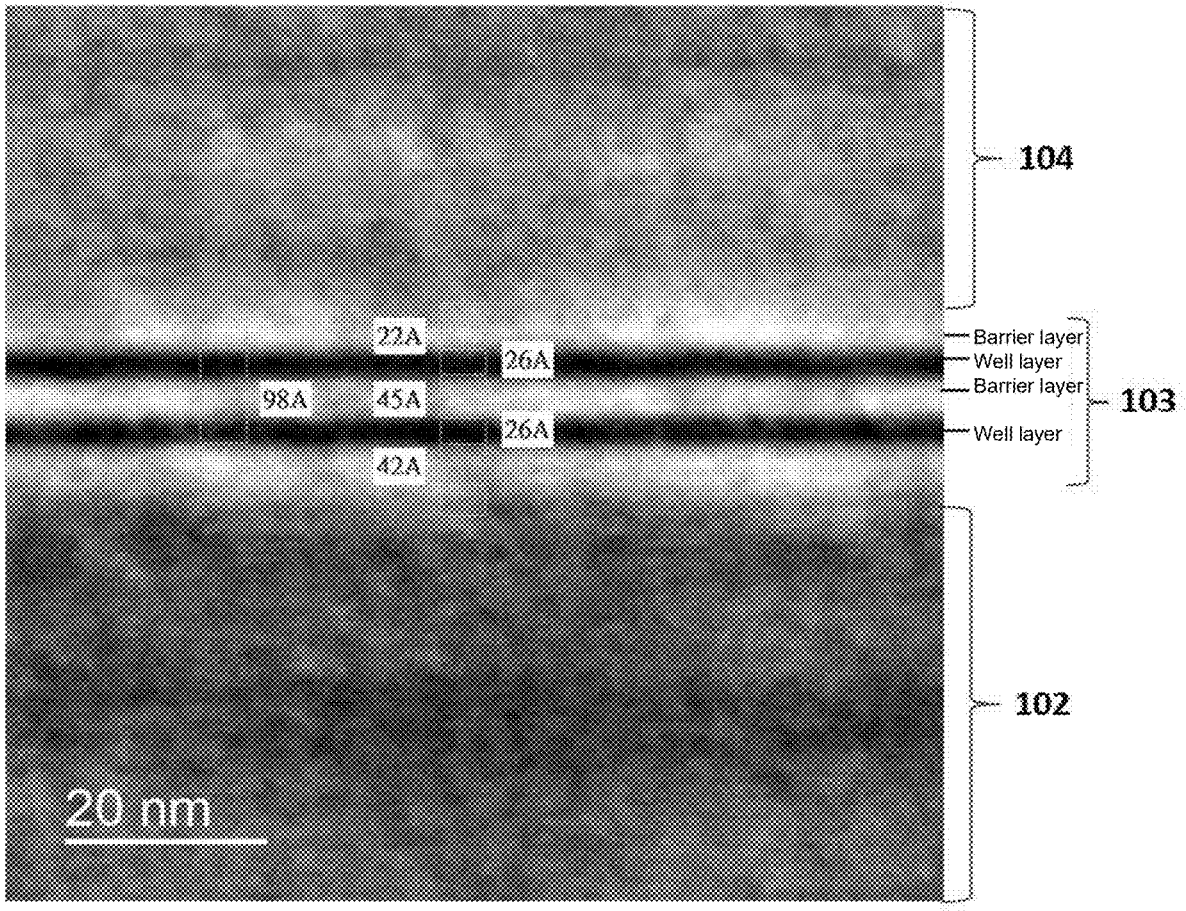
FIG. 6 is a partially enlarged view of a TEM diagram illustrating an exemplary semiconductor laser component when a size of a TEM is 20 nm according to some embodiments of the present disclosure.

FIG. 6 is a partially enlarged view of a TEM diagram illustrating an exemplary semiconductor laser component when a size of a TEM is 20 nm according to some embodiments of the present disclosure.

98 Å, 22 Å, 45 Å, 42 Å, and 26 Å in FIG. 6 may have similar meanings to 1420 Å in FIG. 4.

In some embodiments, the active layer 103 may include a plurality sets of periodic structures. Each set of the plurality sets of periodic structures may include well layers and barrier layers, as shown in FIG. 6. The plurality sets of periodic structures may include 1-3 sets of periodic structures. For example, the plurality sets of periodic structures may include 1 set of periodic structures. As another example, the plurality sets of periodic structures may include 2 sets of periodic structures. As another example, the plurality sets of periodic structures may include 3 sets of periodic structures.

The well layer refers to a region of the semiconductor laser component of which electron energy is above a valence band but below a conduction band.

The barrier layer refers to a barrier layer formed in a PN junction of the semiconductor laser component due to the diffusion of electrons and holes.

In some embodiments, each of the barrier layers of the active layer may include at least one of GaN, InGaN, InN, AlInN, AlGaN, AlInGaN, AlN, GaAs, GaP, InP, AlGaAs, AlInGaAs, AlGaInP, InGaAs, InGaAsN, AlInAs, AlInP, AlGaP, InGaP, GaSb, InSb, InAs, InAsSb, AlGaSb, AlSb, InGaSb, AlGaAsSb, InGaAsSb, SiC, Ga$_2$O$_3$, BN, and diamond.

In some embodiments, a thickness of each of the barrier layers of the active layer may be within a range of 10 Å-200 Å. For example, the thickness of each of the barrier layers of the active layer may be 10 Å. As another example, the thickness of each of the barrier layers of the active layer may be 105 Å. As another example, the thickness of each of the barrier layers of the active layer may be 200 Å.

The upper waveguide layer 104 may be configured to suppress optical absorption loss.

FIG. 7 is a partially enlarged view of a TEM diagram illustrating an exemplary semiconductor laser component when a size of a TEM is 100 nm according to some embodiments of the present disclosure. 2328 Å in FIG. 7 may have a similar meaning to 1420 Å in FIG. 4.

FIG. 8 is a partially enlarged view of a TEM diagram illustrating an exemplary semiconductor laser component when a size of a TEM is 200 nm according to some embodiments of the present disclosure. 3156 Å and 1783 Å in FIG. 8 may have similar meanings to 1420 Å in FIG. 4.

The electron blocking layer 105 may be configured to confine electrons within a light emitting region of the upper waveguide layer 104. The electron blocking layer may prevent the electrons from overflowing into the upper waveguide layer 104 under high current injection to cause a decrease in the luminous efficiency and luminous quality, such as the electron blocking layer 105 shown in FIG. 7, and the electron blocking layer 105 shown in FIG. 8.

The upper limiting layer 106 may be configured to confine the injection of electrons and holes, and the propagation of light in the semiconductor laser component, such as the upper restriction layer 106 shown in FIG. 7, and the upper restriction layer 106 shown in FIG. 8.

In some embodiments, the lower limiting layer 101, the lower waveguide layer 102, the electron blocking layer 105, and the upper limiting layer 106 may respectively include at least one of GaN, InGaN, InN, AlInN, AlGaN, AlInGaN, AlN, GaAs, GaP, InP, AlGaAs, AlInGaAs, AlGaInP, InGaAs, InGaAsN, AlInAs, AlInP, AlGaP, InGaP, GaSb, InSb, InAs, InAsSb, AlGaSb, AlSb, InGaSb, AlGaAsSb, InGaAsSb, SiC, Ga$_2$O$_3$, BN, and diamond.

The first preset proportion distribution refers to a preset proportion distribution that is satisfied by a content ratio of an element Al to an element H in the active layer.

The second preset proportion distribution refers to a preset proportion distribution that is satisfied by a content ratio of an element In to the element H in the active layer.

The third preset proportion distribution refers to a preset proportion distribution that is satisfied by a content ratio of an element Si to the element H in the active layer.

The fourth preset proportion distribution refers to a preset proportion distribution that is satisfied by a content ratio of an element Mg to the element H in the active layer.

In some embodiments, the first preset proportion distribution, the second preset proportion distribution, the third preset proportion distribution, and the fourth preset proportion distribution may correspond to a plurality of distribution forms.

For example, the second preset proportion distribution may correspond to a curvilinear distribution of any sinusoidal function, the third preset proportion distribution may correspond to a curvilinear distribution of any quadratic function, and the first preset proportion distribution and the fourth preset proportion distribution may respectively correspond to a curvilinear distribution of any linear function.

The semiconductor laser component has heat loss in the process of generating laser. Specifically, in the process of generating the laser by the semiconductor laser component, the Stokes frequency shift loss formed by a photon energy difference between pump light and oscillation light used may be converted into heat, and the energy loss of which a coupling rate of a pump energy level to an upper energy level of the laser is not 1 may be converted into heat. Such heat may generate a large amount of waste heat, making a temperature distribution of the semiconductor laser component uneven, causing an uneven distribution of thermal expansion and thermal stress, generating temperature quenching, and causing the semiconductor laser component to break, the thermal lens effect and the stress birefringence effect.

The thermal lens effect may create a lens-like phenomenon in space. The stress birefringence effect may alter a polarization state of incident light, depolarizing and distorting a laser beam produced by the semiconductor laser component.

Taking the semiconductor laser component as a blue light laser for example, a beam quality factor and a temperature quenching ratio of a conventional blue light laser and the blue light laser in the present disclosure are measured and shown in Table I below:

| Blue light laser-item | Conventional blue light laser | Blue light laser in the present disclosure | magnitude of change |
|---|---|---|---|
| Beam quality factor (M$^2$) | 3.9 | 2.1 | 86% |
| Temperature quenching ratio (PPM) | 109 | 13 | −88% |

The beam quality factor is used to characterize a degree of defects in an actual laser beam. The beam quality factor is a common parameter used to measure the quality of a laser beam. The beam quality factor is a dimensionless parameter.

The beam quality factor may be calculated using the following first equation:

$$M^2 = \frac{R \times \theta}{R_0 \theta_0},$$

wherein $M^2$ denotes the beam quality factor, R denotes a beam waist radius of an actual laser beam, $R_0$ denotes a beam waist radius of a fundamental mode Gaussian beam, θ denotes a far-field divergence angle of the actual laser beam, and $\theta_0$ denotes a far-field divergence angle of the fundamental mode Gaussian beam. The closer the beam quality factor is to 1, the better the laser beam quality.

Temperature quenching refers to a phenomenon that for the semiconductor laser component, as the temperature rises, a luminous intensity of the semiconductor laser component decreases, and an emission spectrum redshifts. Redshift leads to a decrease in the frequency of the oscillating light of the semiconductor laser component, affecting the quality of the laser beam produced by the semiconductor laser component.

The temperature quenching ratio refers to a ratio of electrons in atoms or molecules that cause temperature quenching in the oscillating light to total electrons in the atoms or molecules in the oscillating light. The temperature quenching ratio may reflect the quality of the laser beam produced by the semiconductor laser component. For example, the higher the temperature quenching ratio, the worse the quality of the laser beam produced by the semiconductor laser component.

According to Table I, the beam quality factor of the blue light laser of the present disclosure is improved from 3.9 to 2.1, an improvement of 86%, compared to that of the conventional blue laser; and the temperature quenching ratio of the of the blue light laser of the present disclosure is decreased from 109 PPM to 13 PPM, a decrease of 88%.

According to the experimental results, by regulating the content ratio of the element Al to the element H, the content ratio of the element In to the element H, the content ratio of the element Si to the element H, the content ratio of the element Mg to the element H, and the content ratio of the element C to the element O in the active layer of the semiconductor laser component to satisfy the specific preset distributions, the segregation of the chemical composition (e.g., the element In) in the active layer can be regulated, non-radiative recombination and defects can be suppressed, the Stokes frequency shift heat loss caused by the energy difference between the pump light and the oscillating light in the process of generating the laser light by the semiconductor laser component can be reduced, the waste heat generation rate of the semiconductor laser component can be lowered, and the thermal expansion and thermal mismatch stress of the semiconductor laser component can be reduced, thereby suppressing temperature quenching and thermal mismatch fracture of the semiconductor laser component.

Meanwhile, the thermal lens effect and the stress birefringence effect of the semiconductor laser component can be suppressed, and the temperature quenching ratio can be reduced, thereby reducing the depolarization and distortion of the laser beam of the semiconductor laser component, and improving the beam quality factor.

Figure 2:
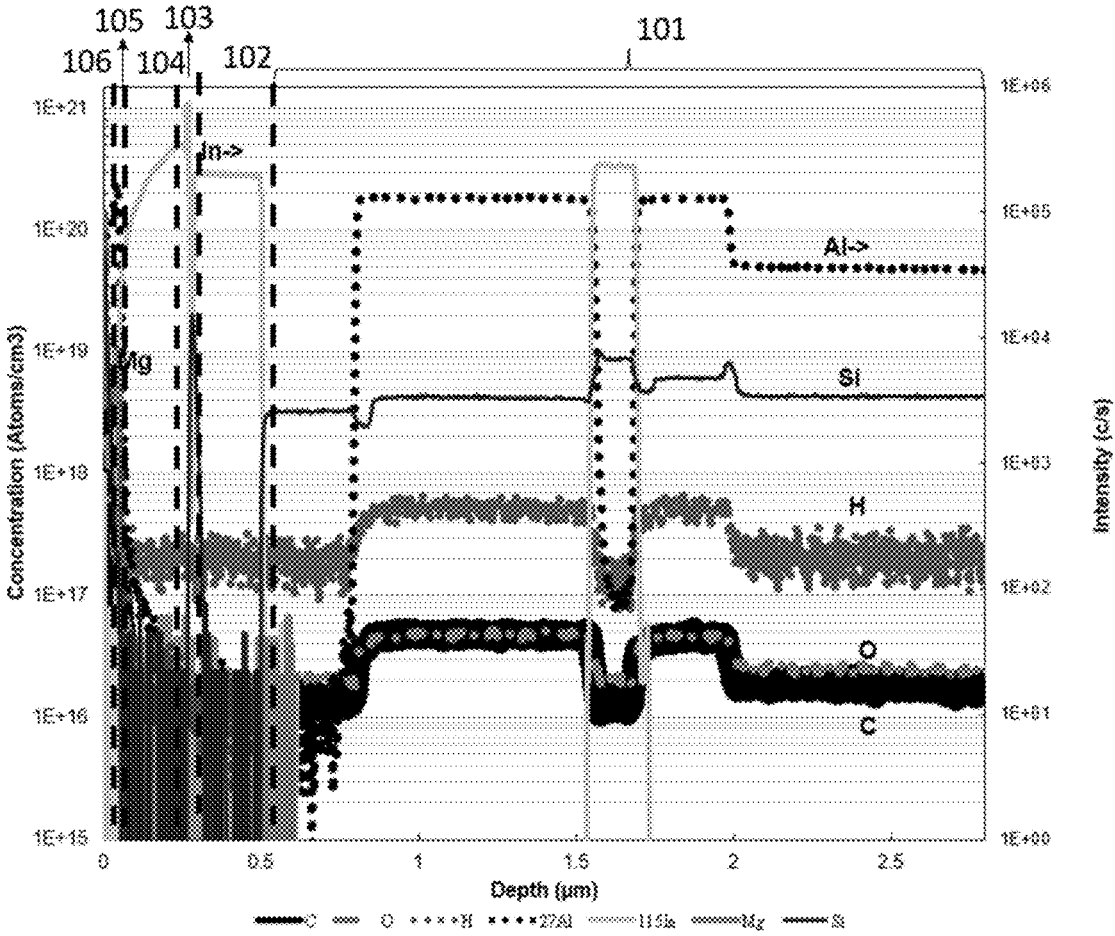
FIG. 2 is a secondary ion mass spectroscopy (SIMS) illustrating an exemplary semiconductor laser component according to some embodiments of the present disclosure.
Figure 3:
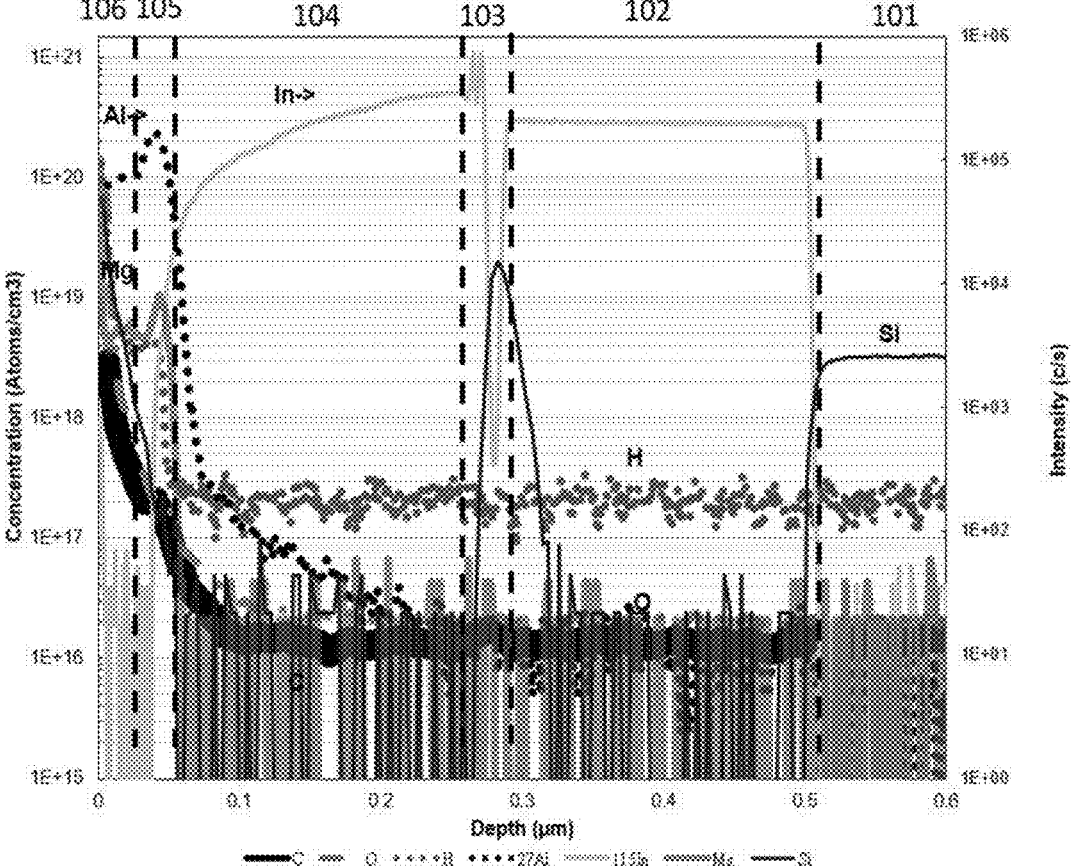
FIG. 3 is an SIMS illustrating an exemplary semiconductor laser component according to some embodiments of the present disclosure.

FIG. 2 is an SIMS illustrating an exemplary semiconductor laser component according to some embodiments of the present disclosure. FIG. 3 is an SIMS illustrating an exemplary semiconductor laser component according to some embodiments of the present disclosure.

Horizontal axes in FIG. 2 and FIG. 3 represent a depth of each element in the semiconductor laser component in μm. Left vertical axes in FIG. 2 and FIG. 3 represent a concentration of each element in each layer of the semiconductor laser component in atoms/cm³. Right vertical axes in FIG. 2 and FIG. 3 represent an ionic strength of each element in each layer of the semiconductor laser component in a.u.

In some embodiments, a second preset proportion distribution may correspond to a curvilinear distribution of a first function, as shown in FIGS. 2-3. The first function may be y=xsinx, wherein x>0.

In some embodiments, a third preset proportion distribution may correspond to a curvilinear distribution of a second function. The second function may be $y=px^2+qx+r$, wherein p<0, and r and q are arbitrary values.

In some embodiments, a fourth preset proportion distribution, a first preset proportion distribution, and a fifth preset proportion distribution may correspond to a curvilinear distribution of a third function, respectively. The third function may be a linear function.

In some embodiments of the present disclosure, a content ratio of an element In to an element H, a content ratio of an element Si to the element H, a content ratio of an element Mg to the element H, a content ratio of an element Al to the element H, and a content ratio of an element C to an element O in an active layer satisfy a specific optimal curve distribution, respectively, the Stokes frequency shift heat loss caused by the energy difference between pump light and oscillating light used in the semiconductor laser component in the process of generating laser light may be further reduced, a waste heat generation rate, thermal expansion, and thermal mismatch stress of the semiconductor laser component may be reduced, and a temperature quenching ratio and thermal mismatch fracture of the semiconductor laser component may be suppressed. Meanwhile, the thermal lens effect and the stress birefringence effect of the semiconductor laser component may be further suppressed, thereby reducing the temperature quenching ratio and the depolarization and distortion of the laser beam, and improving the beam quality factor.

In some embodiments, a descent angle of a peak position of the second preset proportion distribution in a direction of a lower limiting layer may be α1.

The descent angle refers to an angle between a tangent line and a horizontal line, wherein the tangent line is drawn along a direction of change of a curve corresponding to a starting position and a peak position with the starting position of the curvilinear distribution as a starting point and the peak position as an end point.

In some embodiments, the descent angle α1 may be an angle between a tangent line and the horizontal line, wherein the tangent line is drawn along a direction of change of a curve corresponding to a starting position and the peak position with the starting position (e.g., a starting position (0,0)) of a curvilinear distribution corresponding to the second preset proportional distribution as a starting point and the peak position as an end point.

In some embodiments, an ascending angle of a valley position of the second preset proportion distribution in the direction of the lower limiting layer may be β1.

The ascending angle refers to an angle between a tangent line and the horizontal line, wherein the tangent line is drawn along a direction of change of a curve corresponding to a starting position and a valley position with a starting point of the curve corresponding to a preset proportion distribution as a starting point, and the valley position as an end point.

In some embodiments, the ascending angle 31 may be an angle between a tangent line and the horizontal line, wherein the tangent line is drawn along a direction of change of the curve corresponding to the starting position and the valley position with a starting position (e.g., the starting position (0,0)) of a curve corresponding to the second preset proportion distribution as a starting point and the valley position as an end point.

In some embodiments, a descent angle of a peak position of a sixth preset proportion distribution satisfied by a content ratio of an element In to an element H of an upper waveguide layer in a direction of an upper limiting layer may be $\gamma 1$.

In some embodiments, a descent angle of a peak position of a seventh preset proportion distribution satisfied by a content ratio of an element In to an element H of a lower waveguide layer in a direction of the lower limiting layer may be $\delta$.

In some embodiments, a descent angle of a peak position of a third preset proportion distribution in the direction of the lower limiting layer may be $\theta 1$. Wherein $10°\leq\gamma 1\leq\theta 1\leq\beta 1\leq\alpha 1\leq\delta\leq 90°$. For example, $\gamma 1=10°$, $\theta 1=20°$, $\beta 1=45°$, $\alpha 1=80°$, and $\delta=90°$.

The descent angles $\gamma 1$, $\delta$, and $\theta 1$ may have similar meanings to the descent angle $\alpha 1$.

The peak position refers to a coordinate position corresponding to a highest point on the curve.

The valley position refers to a coordinate position corresponding to a lowest point on the curve.

The sixth preset proportion distribution refers to a preset proportion distribution satisfied by the content ratio of the element In to the element H of the upper waveguide layer.

The seventh preset proportion distribution refers to a preset proportion distribution satisfied by the content ratio of the element In to the element H of the lower waveguide layer.

The sixth preset proportion distribution and the seventh preset proportion distribution may be preset by the person skilled in the art according to actual needs. For example, the sixth preset proportion distribution and the seventh preset proportion distribution may correspond to the curvilinear distribution of the first function, respectively. The first function may be $y=x\sin x$, wherein $x\geq 0$.

In some embodiments of the present disclosure, by setting the descent angles of the peak position and the valley position of the preset proportion distribution satisfied by the content ratio of the element In to the element H of the active layer, the peak position of the preset proportion distribution satisfied by the content ratio of the element Si to the element H of the active layer, and the peak position of the preset proportion distribution satisfied by the content ratio of the element In to the element H of the lower waveguide layer in the direction of the lower limiting layer as $\alpha 1$, $\gamma 1$, $\delta$, and $\theta 1$, and setting the descent angle of the peak position of the preset proportion distribution satisfied by the content ratio of the element In to the element H of the upper waveguide layer in the direction of the upper limiting layer as $\beta 1$, wherein $10°\leq\gamma 1\leq\theta 1\leq\beta 1\leq\alpha 1\leq\delta\leq 90°$, the Stokes frequency shift heat loss caused by the energy difference between the pump light and the oscillating light used in the process of generating the laser light by the semiconductor laser component may be further reduced, the waste heat generation rate, thermal expansion, and thermal mismatch stress of the semiconductor laser component may be reduced, and the temperature quenching ratio and the thermal mismatch fracture of the semiconductor laser component may be suppressed. Meanwhile, the thermal lens effect and the stress birefringence effect of the semiconductor laser component may be further suppressed, thereby reducing the temperature quenching ratio and the depolarization and distortion of the laser beam, and improving the beam quality factor.

In some embodiments, a peak value of a dielectric constant distribution of the upper waveguide layer 104 may be greater than or equal to a peak value of a dielectric constant distribution of the lower waveguide layer 102, and a valley value of the dielectric constant distribution of the upper waveguide layer 104 may be less than or equal to a valley value of the dielectric constant distribution of the lower waveguide layer 102.

The dielectric constant distribution refers to a curvilinear distribution corresponding to a range of dielectric constants.

In some embodiments, a peak value of a refractive index coefficient distribution of the upper waveguide layer 104 may be greater than or equal to a peak value of a refractive index coefficient distribution of the lower waveguide layer 102, and a valley value of the refractive index coefficient distribution of the upper waveguide layer 104 may be less than or equal to a valley value of the refractive index coefficient distribution of the lower waveguide layer 102.

The refractive index coefficient distribution is refers to a curvilinear distribution corresponding to a range of refractive index coefficients.

In some embodiments of the present disclosure, by setting a difference in the refractive index coefficient distribution and the dielectric constant distribution between the upper waveguide layer and the lower waveguide layer, a light field distribution of light fields in the upper waveguide layer and the lower waveguide layer may be regulated, the degeneracy of photons may be improved and the light field dissipation may be reduced, the mode number and inter-mode variation of the laser light may be reduced, the coherence and far-field FFP quality of the laser light may be improved, and the focus spot resolution and the beam quality of the laser light generated by the semiconductor laser component may be improved.

In some embodiments, the dielectric constant distribution of the upper waveguide layer may correspond to a curvilinear distribution of a fourth function. The fourth function may be $y=\log_a x$ ($a>1$).

The dielectric constant distribution of the lower waveguide layer may correspond to a curvilinear distribution of a fifth function. The fifth function may be $y=dx+e$.

The refractive index coefficient distribution of the upper waveguide layer may correspond to a curvilinear distribution of a sixth function. The sixth function may be $y=\log_b x$ ($b>1$).

The refractive index coefficient distribution of the lower waveguide layer may correspond to a curvilinear distribution of a seventh function. The seventh function may be $y=fx+g$.

The sixth preset proportion distribution satisfied by the content ratio of the element In to the element O of the upper waveguide layer may correspond to a curvilinear distribution of an eighth function. The eighth function may be $y=\log_c x$ ($c>1$).

The seventh preset proportion distribution satisfied by the content ratio of the element In element to the element O of the lower waveguide layer may correspond to a curvilinear distribution of a ninth function. The ninth function may be $y=hx+j$.

Coefficients of the fourth function, the sixth function, and the eighth function may have the following relationship: $1<a\leq b\leq c$. For example, $a=2$, $b=3$, $c=4$.

Coefficients of the fifth function, the seventh function, and the ninth function may have the following relationship: $g\leq e\leq j$, and g, e, and j may be any number greater than 0.

In some embodiments of the present disclosure, by setting the curvilinear distributions corresponding to the refractive index coefficient distributions and the curvilinear distributions corresponding to the dielectric constant distributions of the upper waveguide layer and the lower waveguide layer as the curvilinear distributions of the specific functions, the difference between the refractive index coefficient distributions and the dielectric constant distributions of the upper waveguide layer and the lower waveguide layer may be optimized, so that the light field distribution of the light fields in the upper waveguide layer and the lower waveguide layer may be better regulated, the degeneracy of photons may be improved and the light field dissipation may be reduced, the mode number and inter-mode variation of the laser light may be reduced, and the coherence and far-field FFP quality, the focus spot resolution and the beam quality of the laser light generated by the semiconductor laser component may be improved.

In some embodiments, an eighth preset proportion distribution satisfied by the content ratio of the element In to the element H of the lower waveguide layer may correspond to a curvilinear distribution in a third quadrant of a tenth function. The tenth function may be $y=\sin x/x^2$.

A ninth preset proportion distribution satisfied by the content ratio of the element In to the element H of the upper waveguide layer may correspond to a curvilinear distribution of an eleventh function. The eleventh function may be $y=x^{1/2}$.

A tenth preset proportion distribution satisfied by the content ratio of the element Si to the element H of the lower waveguide layer may correspond to a curvilinear distribution of a twelfth function. The twelfth function may be $y=\ln x/e^x$.

An eleventh preset proportion distribution satisfied by the content ratio of the element Al to the element H and a twelfth preset proportion distribution satisfied by the content ratio of the element C to the element O of the lower waveguide layer may correspond to a curvilinear distribution of a thirteenth function, respectively. The thirteenth function may be a constant function.

The third quadrant refers to a region of a plane rectangular coordinate system that lies below a horizontal axis (e.g., an x-axis) and to the left of a vertical axis (e.g., a y-axis).

An increase in a thickness of the lower limiting layer of the semiconductor laser component (e.g., a nitride semiconductor laser) may reduce the refractive index of the lower limiting layer, but an increase in the thickness of the lower limiting layer may result in a restricted range of regulation of various elements of the semiconductor laser component, causing problems such as cracking, bending, and quality degradation. Meanwhile, the light field has dissipation, and leakage of light field modes to the substrate to form standing waves may lead to low suppression efficiency of the substrate mode, and poor quality of the far-field image FFP. Patterns of laser light waves generated by the semiconductor laser component may be divided into a transverse mode and a longitudinal mode. A transverse mode light intensity distribution within a cross section perpendicular to an optical axis may be determined by a waveguide structure of the semiconductor laser. If the transverse mode is complex and unstable, the output light has poor coherence. The longitudinal mode may have a standing wave distribution in a direction of resonant cavity propagation. If a lot of longitudinal modes are excited at the same time or there are intermodal variations, a high temporal coherence may not be obtained, resulting in a poor quality of the far-field image FFP.

Taking the semiconductor laser component as a green light laser for example, the beam quality factor and the focus spot resolution of a conventional green light laser and the green light laser of the present disclosure are measured and shown in Table II below:

| Green light laser-item | Conventional green light laser | the green light laser of the present disclosure | magnitude of change |
|---|---|---|---|
| Beam quality factor | 1.89 | 0.96 | 97% |
| Focus spot resolution (nm) | >200 | <30 | −85% |

The focus spot resolution refers to a resolution of bright spots that form at an edge of a surface of the semiconductor laser when the semiconductor laser component generates the laser light. The magnitude of the focus spot resolution may reflect the quality of the laser beam generated by the semiconductor laser component. For example, the higher the focus spot resolution, the worse the quality of the laser beam generated by the semiconductor laser component.

According to Table II, the beam quality factor of the green light laser of the present disclosure improves from 1.89 to 0.96 compared to that of the conventional green light laser, which is an increase of 97%; and the focus spot resolution of the green light laser of the present disclosure decreases from greater than 200 nm to less than 30, which is a significant decrease of −85%.

According to the experimental results, by setting the content ratio of the element In to the element H, the content ratio of the element Si to the element H, and the content ratio of the element Al to the element H of the lower waveguide layer of semiconductor laser as the specific curvilinear distributions, and setting the content ratio of the element In to the element H of the upper waveguide layer as the specific ratio distribution, the degeneracy of photons can be improved and the light field dissipation can be reduced, the mode number and inter-mode variation of the laser light can be reduced, and the coherence and far-field FFP quality, the beam quality factor and the focus spot resolution of the laser light can be improved.

Figure 9:
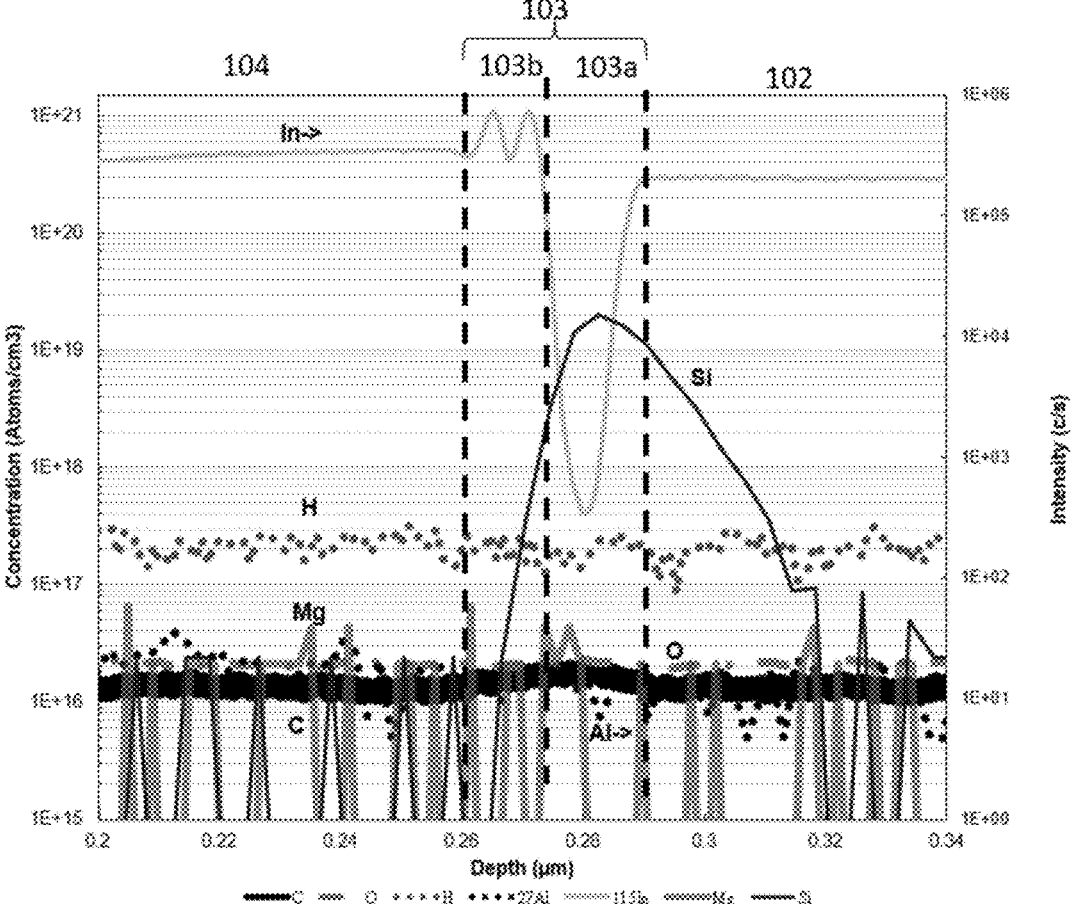
FIG. 9 is an SIMS illustrating an exemplary semiconductor laser component according to some embodiments of the present disclosure.

FIG. 9 is an SIMS illustrating an exemplary semiconductor laser component according to some embodiments of the present disclosure. A horizontal axis in FIG. 9 represents a depth of each element in the semiconductor laser component in μm. A left vertical axis in FIG. 9 represents a concentration of each element in each layer of the original semiconductor component in atoms/cm$^3$. A right vertical axis in FIG. 9 represents an ionic strength of each element in each layer of the semiconductor laser component in a.u.

An internal optical absorption loss of a conventional semiconductor laser component (e.g., a nitride semiconductor laser) may include an impurity absorption loss, a carrier absorption loss, a waveguide structure sidewall scattering loss, and a quantum well absorption loss. Refractive index dispersion of the semiconductor laser component, and the concentration fluctuation of high-concentration carriers may affect a refractive index of an active layer, and the limiting factor may decrease as the wavelength increases, which leads to a decrease in the mode gain of the conventional semiconductor laser component. After excitation of the conventional semiconductor laser component, carrier concentration in an active region of a multi-quantum well may be saturated, a bipolar conductance effect may be weakened, and series resistance may be increased, which also leads to a voltage rise in the conventional semiconductor laser component.

In order to solve the above problems existing in the conventional semiconductor laser component, each parameter of a first active layer of the semiconductor laser component may be set as follows In some embodiments, the active layer may include a first active layer 103a and a second active layer 103b, as shown in FIG. 9.

The first active layer 103a refers to a partial thin layer partially separated from the active layer.

The second active layer 103b refers to another thin layer separated from the active layer and different from the first active layer.

A Phillips ionization degree distribution of the first active layer 103a may have a V-shaped distribution. The Phillips ionization degree distribution may correspond to a curvilinear distribution of a fourteenth function. The fourteenth function may be $y=x^2+e^x$.

The Phillips ionization degree distribution refers to a curvilinear distribution corresponding to a range of Phillips ionization degrees.

The Phillips ionization degree may be used to characterize a proportion of ionizable particles in the first active layer to total particles.

In some embodiments, a conduction band effective state density distribution of the first active layer may present an inverted V-shaped distribution. The conduction band effective state density distribution may correspond to a curvilinear distribution in a third quadrant of a fifteenth function. The fifteenth function may be $y=\sin x/x$.

The conduction band effective state density distribution refers to a curvilinear distribution corresponding to a range of conduction band effective state densities.

The conduction band effective state density refers to a distribution density of crystal electrons per unit wavevector space in a conduction band.

In some embodiments, a breakdown field strength distribution of the first active layer may present a first parabolic distribution. An opening of a first parabola may face upward. The breakdown field strength distribution may correspond to a curvilinear distribution of a sixteenth function. The sixteenth function may be $y=Ax^2+Bx+C$, wherein A>0, and B and C are arbitrary numbers.

The first parabola refers to a parabola formed by a quadratic function with the opening facing upward.

The breakdown field strength distribution refers to a curvilinear distribution corresponding to a range of breakdown field strengths.

The breakdown field strength refers to a highest electric field strength that the first active layer withstands to avoid breakdown under the action of an electric field.

In some embodiments, a thermal conductivity distribution of the first active layer may present a second parabolic distribution. An opening of a second parabola may face downward The thermal conductivity distribution may correspond to a curvilinear distribution of a seventeenth function. The seventeenth function may be $y=Dx^2+Ex+F$, wherein D<0, and D and E are arbitrary numbers.

The second parabola refers to another parabola formed by the quadratic function with the opening facing downward.

The thermal conductivity distribution refers to a curvilinear distribution corresponding to a range of thermal conductivities.

In some embodiments, a thirteenth preset proportion distribution satisfied by a content ratio of an element In to an element H of the first active layer may present a third parabolic distribution. An opening of a third parabola may face upward. The thirteenth preset proportion distribution may correspond to a curvilinear distribution of an eighteenth function. The eighteenth function may be $y=Gx^2+Hx+I$, wherein G>0, H and I may be arbitrary numbers.

The third parabola may be a parabola formed by the quadratic function with the opening facing upward.

Taking the semiconductor laser component as a blue light laser for example, a threshold current density, an optical power, a voltage, a limiting factor, and an internal optical loss of a conventional blue light laser and a blue light laser of the present disclosure are measured and shown in Table III below:

| Blue light laser-item | The conventional blue light laser | The blue light laser of the present disclosure | Magnitude of Change |
|---|---|---|---|
| Threshold current density (kA/cm²) | 2.4 | 0.63 | −74% |
| Optical power (W) | 5.7 | 14.5 | 154% |
| Voltage (V) | 6.5 | 3.7 | −43% |
| limiting factor | 1.40% | 3.19% | 128% |
| Internal optical loss (cm⁻¹) | 17.2 | 7.1 | −59% |

The threshold current density refers to a critical value of the semiconductor laser component when the current density reaches a certain value, the semiconductor laser component exhibits a significant change in electrical properties.

The optical power refers to the work done by light per unit time. The unit of the optical power is watt, and the symbol is W.

The voltage refers to the voltage used by the semiconductor laser component.

The limiting factor may affect the mode gain of the semiconductor laser component, thus affecting the magnitude of the threshold current of the semiconductor laser component. The limiting factor may be affected by factors such as optical limiting and carrier limiting. The influences of optical limiting factors may include the effect of diffraction, distortion, reflection, and other factors of light on the semiconductor laser component. Under the same optical loss condition, the worse the limiting factor of the semiconductor laser component, the higher the threshold carrier concentration in the active layer of the semiconductor laser produces excited radiation, which induces electron leakage, reducing the electron injection efficiency and the slope efficiency.

In some embodiments, the worse the limiting factor, the worse the quality of the far-field FFP image.

The internal optical loss refers to attenuation of light intensity due to various physical factors when light propagates within the semiconductor laser component.

According to Table III, the threshold current density of the blue light laser of the present disclosure is reduced from 2.4 to 0.63 compared to that of the conventional blue light laser, a decrease of −74%; the optical power of the blue light laser of the present disclosure is increased from 5.7 to 14.5 compared to that of the conventional blue light laser, an increase of 154%; the voltage of the blue light laser of the present disclosure is reduced from 6.5 to 3.7 compared to the conventional blue light laser, a decrease of −43%; the limiting factor of the blue light laser of the present disclosure is increased from 1.40% to 3.19% compared to that of the conventional blue light laser, an increase of 128%; and the internal optical losses of the blue light laser of the present disclosure is reduced from 17.2 to 7.1, a decrease of −59%.

According to the experimental data, by setting the curvilinear distribution of the range of each parameter of the first active layer, the carrier absorption loss of the active layer and the sidewall scattering loss of the lower waveguide layer can be reduced, the refractive index dispersion can be improved to reduce the internal optical absorption loss of the semiconductor laser component, thereby improving the limiting factor of the semiconductor laser component and the optical power of the semiconductor laser component. Meanwhile, the bipolar conductance and series resistance of the semiconductor laser component can be reduced, thereby reducing the voltage and the threshold current density of the semiconductor laser component.

Figure 10:
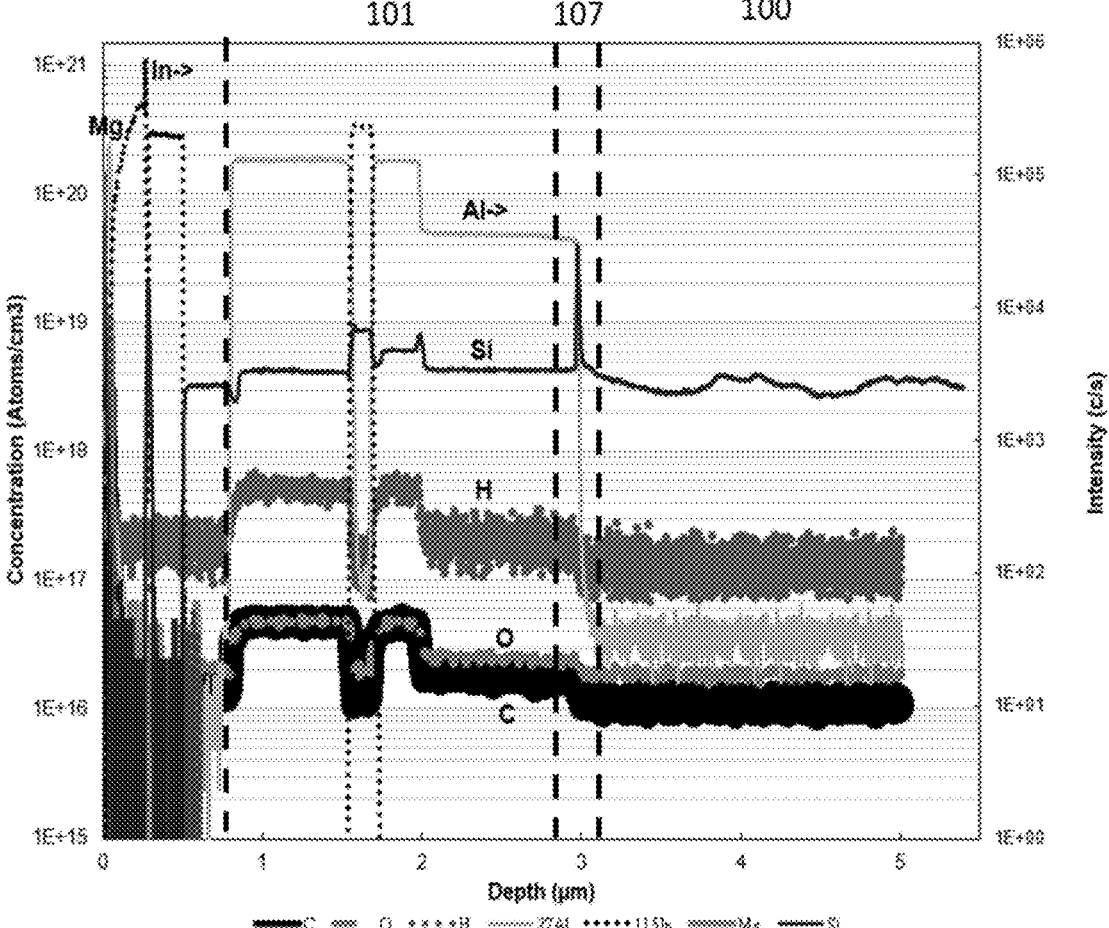
FIG. 10 is an SIMS illustrating an exemplary semiconductor laser component according to some embodiments of the present disclosure.

FIG. 10 is an SIMS illustrating an exemplary semiconductor laser component according to some embodiments of the present disclosure. A horizontal axis in FIG. 10 represents a depth of each element in the semiconductor laser component in μm. A left vertical axis in FIG. 10 represents a concentration of each element in each layer of the semiconductor laser component in atoms/cm$^3$. A right vertical axis in FIG. 10 represents an ionic strength of each element in each layer of the semiconductor laser component in a.u.

An internal optical absorption loss of a conventional semiconductor laser component may include an impurity absorption loss, a carrier absorption loss, a waveguide structure sidewall scattering loss, a quantum well absorption loss, etc. When the optical waveguide impurity absorption loss of the conventional semiconductor laser component is high, intrinsic carbon impurities in a p-type semiconductor may compensate an acceptor, destroy a p-type, etc., which leads to a low ionization rate of p-type doping (e.g., the ionization rate of p-type doping is lower than 10% or less). A large amount of unionized Mg (e.g., 90% or more) may be subjected to the main impurities, producing a self-compensating effect and causing a rise in the internal optical loss, resulting in a decrease in the slope efficiency and an increase in threshold current of the conventional semiconductor laser component, which causes that the unintentionally doped upper waveguide layer confines the internal light field within the upper waveguide layer, reduces the overlap of the light field with a p-type AlGaN electron blocking layer above the waveguide layer, and reduces the absorption loss of light field by the unionized Mg acceptor. In addition, the refractive index dispersion of the conventional semiconductor laser component and the high carrier concentration fluctuation may affect the refractive index of the active layer, and the limiting factor may decrease with the increase of wavelength, leading to a decrease in the mode gain of conventional semiconductor laser component.

In order to solve the above problems of the conventional semiconductor laser component, the semiconductor laser component may be configured to include an electron blocking layer as follows.

In some embodiments, as shown in FIG. 10, an electron affinity energy distribution of the electron blocking layer 107 may present a V-shaped distribution, a Phillips ionization degree distribution of the electron blocking layer 107 may present a V-shaped distribution, an electron mobility distribution of the electron blocking layer 107 may present a V-shaped distribution, and an electron effective mass distribution of the electron blocking layer 107 may present an inverted V-shaped distribution.

The electron affinity energy distribution refers to a curvilinear distribution corresponding to a range of electron affinity energy. The electron affinity energy refers to energy released by atoms to form anions by obtaining electrons.

The electron mobility distribution refers to a curvilinear distribution corresponding to a range of electron mobility.

The electron mobility refers to a rate of directional migration acquired by electrons under the influence of a unit external electric field.

The electron effective mass distribution refers to a curvilinear distribution corresponding to a range of electron effective mass. The electron effective mass may be used to characterize a motion mode such as a motion speed and a behavior of electrons in an energy band.

In some embodiments, the electron affinity energy distribution of the electron blocking layer may correspond to a curvilinear distribution of a nineteenth function. The nineteenth function may be $y=u^{|x-m|}$, wherein u>1, and m>0.

In some embodiments, the Phillips ionization degree distribution of the electron blocking layer may correspond to a curvilinear distribution of a twentieth function. The twentieth function may be $y=w^{|x-n|}$, wherein w>1, and n>0.

In some embodiments, the electron mobility distribution of the electron blocking layer may correspond to a curvilinear distribution of a twenty-first function. The twenty-first function may be $y=s^{|x-t|}$, wherein s>1, and t>0.

In some embodiments, the electron effective mass distribution of the electron blocking layer may correspond to a curvilinear distribution in a third quadrant of a twenty-second function. The twenty-second function may be $y=x+k/x$, wherein k>0.

Taking the semiconductor laser component as a blue light laser for example, man optical power, a limiting factor, and an internal optical loss of a conventional blue light laser and a blue light laser of the present disclosure are measured and shown in Table IV below:

| Blue light laser-item | The conventional blue light laser | The blue light laser of the present disclosure | magnitude of change |
|---|---|---|---|
| Optical power (W) | 5.9 | 14.7 | 149% |
| Limiting factor | 1.40% | 3.39% | 142% |
| Internal optical loss (cm$^{-1}$) | 17.2 | 6.4 | −63% |

According to Table IV, the optical power of the blue light laser of the present disclosure is increased from 5.9 to 14.7 compared to that of the conventional blue light laser, an increase of 149%; the limiting factor of the blue light laser of the present disclosure is increased from 1.40% to 3.39% compared to that of the conventional blue light laser, an increase of 142%; and the internal optical loss of the blue light laser of the present disclosure is reduced from 17.2 to 3.39% compared to that of the conventional blue light laser, a decrease of −63%.

According to the experimental results, by the design of the electron blocking layer, the overlap of the light field of the semiconductor laser component with the upper limiting layer can be reduced, the optical absorption loss and the carrier absorption loss of the unionized receptor can be suppressed, and the refractive index dispersion can be regulated to enhance the limiting factor, thereby improving the mode gain of the semiconductor laser component.

In some embodiments, the current expansion layer 107 may be provided between the substrate 100 and the lower limiting layer 101.

The current expansion layer 107 may be a highly doped and highly conductive layer. The current expansion layer 107 may be configured to perform current expansion.

In some embodiments, the current expansion layer 107 may include at least one material of GaN, AlGaN, AlInGaN, AlInN, and AlN.

In some embodiments, a thickness of the current expansion layer 107 may be within a range of 10 Å-5000 Å. For example, the thickness of the current expansion layer 107 may be 10 Å. As another example, the thickness of the current expansion layer 107 may be 2495 Å.

In some embodiments, an element Al content distribution of the current expansion layer 107 may correspond to a curvilinear distribution in a third quadrant of a twenty-third function. The twenty-third function may be $y=\sin x/x^2$.

In some embodiments, a Si doping concentration distribution of the current expansion layer 107 may correspond to a curvilinear distribution of a quadratic function, a quadratic coefficient of the quadratic function being less than 0.

In some embodiments, a Si doping concentration distribution of the substrate 100 may correspond to a curvilinear distribution of a twenty-fourth function. The twenty-fourth function may be $y=\sin|x|$.

In some embodiments, an element C content distribution, an element O content distribution, and an element H content distribution of the current expansion layer may respectively correspond to a curvilinear distribution of a twenty-fifth function. The twenty-fifth function may be $y=\operatorname{arccot}x$.

In some embodiments, the Al element content distribution of the current expansion layer may present a downward trend in a direction towards the substrate. A descent angle may be $\alpha2$, wherein $45°\leq\alpha2\leq90°$. For example, $\alpha2=67.5°$. As another example, $\alpha2=90°$. The descent angle $\alpha2$ may be an angle between a tangent line and a horizontal line, wherein the tangent line is drawn in a direction of change of a curve corresponding to a starting position and a peak position with the starting position (e.g., a starting position $(0,1)$) of a curvilinear distribution corresponding to the element Al content distribution of the current expansion layer as a starting point, and the peak position as an end point.

In some embodiments, the Si doping concentration distribution may present a downward trend in the direction towards the substrate. A descent angle may be denoted as $\beta2$, wherein $40°\leq\beta2\leq85°$. For example, $\beta2=40°$. As another example, $\beta2=62.5°$. As another example, $\beta2=85°$.

In some embodiments, the H element content distribution may present a downward trend in the direction towards the substrate. A descent angle may be denoted as $\gamma2$, wherein $30°\leq\gamma2\leq75°$. For example, $\gamma2=30°$. As another example, $\gamma2=52.5°$. As another example, $\gamma2=75°$.

In some embodiments, the O element content distribution may present a downward trend in the direction towards the substrate. A descent angle may be denoted as $\theta2$, wherein $40°\leq\theta2\leq85°$. For example, $\theta2=40°$. As another example, $\theta2=62.5°$. As another example, $\theta2=85°$.

In some embodiments, the C element content distribution may present a downward trend in the direction towards the substrate. A descent angle may be denoted as $\varphi$, wherein $40°\leq\varphi\leq90°$. For example, $\varphi=40°$. As another example, $\varphi=65°$. As another example, $\varphi=90°$.

The descent angle $\beta2$, the descent angle $\gamma2$, the descent angle $\theta2$, and the descent angle $\varphi$ may be determined in a similar manner as the descent angle $\alpha2$.

In some embodiments, changing angles of the Al element content distribution, the Si doping concentration distribution, the C element content distribution, the O element content distribution, and the H element content distribution of the current expansion layer may have the following relationship: $\gamma2\leq\theta2\leq\varphi\leq\beta2\leq\alpha2$.

The element Al content distribution refers to a curvilinear distribution corresponding to a range of the content of the element Al.

The element C content distribution, the element O content distribution, and the element H content distribution may have similar meanings to the element Al content distribution.

The Si doping concentration distribution refers to a curvilinear distribution corresponding to a range of a Si doping concentration. The Si doping concentration refers to a concentration of a dopant Si in the current expansion layer.

In some embodiments of the present disclosure, the current expansion layer may be provided to enhance the transverse and longitudinal expansion efficiency of the current of an N-type semiconductor of the semiconductor laser component, reducing the body resistance and the contact resistance of the N-type semiconductor, and lowering the voltage of the semiconductor laser component from above 8.0 V to below 5 V, thereby reducing the power consumption of the semiconductor laser component.

The basic concept has been described above. Obviously, for those skilled in the art, the above detailed disclosure is only an example, and does not constitute a limitation to the present disclosure. Although not expressly stated here, those skilled in the art may make various modifications, improvements and corrections to the present disclosure. Such modifications, improvements and corrections are suggested in this disclosure, so such modifications, improvements and corrections still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that references to "one embodiment" or "an embodiment" or "an alternative embodiment" two or more times in different places in the present disclosure do not necessarily refer to the same embodiment. In addition, certain features, structures, or characteristics in one or more embodiments of the present disclosure may be properly combined.

In the same way, it should be noted that in order to simplify the expression disclosed in this disclosure and help the understanding of one or more embodiments of the invention, in the foregoing description of the embodiments of the present disclosure, sometimes multiple features are combined into one embodiment, drawings or descriptions thereof. This method of disclosure does not, however, imply that the subject matter of the disclosure requires more features than are recited in the claims. Rather, claimed subject matter may lie in less than all features of a single foregoing disclosed embodiment.

In some embodiments, counts describing the quantity of components and attributes are used. It should be understood that such counts used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the disclosure and claims are approximations that can vary depending upon the desired characteristics of individual embodiments. In some embodiments, numerical parameters should consider the specified significant digits and adopt the general digit retention method. Although the numerical ranges and parameters used in some embodiments of the present disclosure to confirm the breadth of the range are approximations, in specific embodiments, such numerical values are set as precisely as practicable.

Each of the patents, patent applications, publications of patent applications, and other material, such as articles, books, specifications, publications, documents, things, and/ or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A semiconductor laser component comprising, from bottom to top, a substrate, a lower limiting layer, a lower waveguide layer, an active layer, an upper waveguide layer, an electron blocking layer, and an upper limiting layer, wherein the active layer satisfies at least one of that a content ratio of an element Al to an element H satisfies a first preset proportion distribution, a content ratio of an element In to the element H satisfies a second preset proportion distribution, a content ratio of an element Si to the element H satisfies a third preset proportion distribution, a content ratio of an element Mg to the element H satisfies a fourth preset proportion distribution, and a content ratio of an element C to an element O satisfies a fifth preset proportion distribution, wherein an electron affinity energy distribution of the electron blocking layer is a V-shaped distribution, a Phillips ionization degree distribution of the electron blocking layer is a V-shaped distribution, an electron mobility distribution of the electron blocking layer is a V-shaped distribution, and an electron effective mass distribution of the electron blocking layer is an inverted V-shaped distribution;

the electron affinity energy distribution of the electron blocking layer corresponds to a curvilinear distribution of a nineteenth function, the nineteenth function being $y=u^{|x-m|}$, u>1, and m>0;

the Phillips ionization degree distribution of the electron blocking layer corresponds to a curvilinear distribution of a twentieth function, the twentieth function being $y=w^{|x-n|}$, w>1, and n>0;

the electron mobility distribution of the electron blocking layer corresponds to a curvilinear distribution of a twenty-first function, the twenty-first function being $y=s^{|x-t|}$, s>1, and t>0;

the electron effective mass distribution of the electron blocking layer corresponds to a curvilinear distribution in a third quadrant of a twenty-second function, the twenty-second function being $y=x+k/x$, and k>0;

the active layer includes a first active layer and a second active layer; a Phillips ionization degree distribution of the first active layer is a V-shaped distribution, and the Phillips ionization degree distribution corresponds to a curvilinear distribution of a fourteenth function, the fourteenth function being $y=x^2+e^x$;

a conduction band effective state density distribution of the first active layer is an inverted V-shaped distribution, and the conduction band effective state density distribution corresponds to the curvilinear distribution of a third quadrant of a fifteenth function, the fifteenth function being $y=sinx/x$;

a breakdown field strength distribution of the first active layer is a first parabolic distribution, an opening of a first parabola faces upward, and the breakdown field strength distribution corresponds to a curvilinear distribution of a sixteenth function, the sixteenth function being $y=Ax^2+Bx+C$, A>0, B and C being arbitrary numbers;

a thermal conductivity distribution of the first active layer is a second parabolic distribution, an opening of a second parabola faces downward, and the thermal conductivity distribution corresponds to a curvilinear distribution of a seventeenth function, the seventeenth function being $y=Dx^2+Ex+F$, D<0, E and F being arbitrary numbers; and a thirteenth preset proportion distribution satisfied by a content ratio of an element In elements to an element of H of the first active layer is a third parabolic distribution, an opening of a third parabola faces upward, and the thirteenth preset proportion distribution corresponds to a curvilinear distribution of an eighteenth function, the eighteenth function being $y=Gx^2+Hx+I$, G>0, H and I being arbitrary numbers.

2. The semiconductor laser component of claim 1, wherein the second preset proportion distribution corresponds to a curvilinear distribution of a first function, the first function being $y=xsinx$, and x≥0;

the third preset proportion distribution corresponds to a curvilinear distribution of a second function, the second function being $y=px^2+qx+r$, p<0, r and q being arbitrary values; and the fourth preset proportion distribution, the first preset proportion distribution, and the fifth preset proportion distribution respectively correspond to a curvilinear distribution of a third function, the third function being a linear function.

3. The semiconductor laser component of claim 1, wherein a peak value of a dielectric constant distribution of the upper waveguide layer is greater than or equal to a peak value of a dielectric constant distribution of the lower waveguide layer;

a peak value of a refractive index coefficient distribution of the upper waveguide layer is greater than or equal to a peak value of a refractive index coefficient distribution of the lower waveguide layer;

a valley value of the dielectric constant distribution of the upper waveguide layer is less than or equal to a valley value of the dielectric constant distribution of the lower waveguide layer; and a valley value of the refractive index coefficient distribution of the upper waveguide layer is less than or equal to a valley value of the refractive index coefficient distribution of the lower waveguide layer.

4. The semiconductor laser component of claim 3, wherein the dielectric constant distribution of the upper waveguide layer corresponds to a curvilinear distribution of a fourth function, the fourth function being $y=log_a x$, and a>1;

the dielectric constant distribution of the lower waveguide layer corresponds to a curvilinear distribution of a fifth function, the fifth function being y=dx+e, and d and e being arbitrary values;

the refractive index coefficient distribution of the upper waveguide layer corresponds to a curvilinear distribution of a sixth function, the sixth function being $y=\log_b x$ (b>1);

the refractive index coefficient distribution of the lower waveguide layer corresponds to a curvilinear distribution of a seventh function, the seventh function being y=fx+g, and f and g being arbitrary values;

a sixth preset proportion distribution satisfied by a content ratio of an element In to an element O of the upper waveguide layer corresponds to a curvilinear distribution of an eighth function, the eighth function being $y=\log_c x$ (c>1); and a seventh preset proportion distribution satisfied by a content ratio of an element In element to an element O of the lower waveguide layer corresponds to a curvilinear distribution of a ninth function, the ninth function being y=hx+j, and h and j being arbitrary values; wherein coefficients of the fourth function, the sixth function, and the eighth function have the following relationship: 1<a≤b≤c; and coefficients of the fifth function, the seventh function, and the ninth function have the following relationship: g≤e≤j.

5. The semiconductor laser component of claim 3, wherein an eighth preset proportion distribution satisfied by a content ratio of an element In to an element H of the lower waveguide layer corresponds to a curvilinear distribution in a third quadrant of a tenth function, the tenth function being $y=\sin x/x^2$;

a ninth preset proportion distribution satisfied by a content ratio of an element In elements to an element H of the upper waveguide layer corresponds to a curvilinear distribution of an eleventh function, the eleventh function being $y=x^{1/2}$;

a tenth preset proportion distribution satisfied by a content ratio of an element Si to the element H of the lower waveguide layer corresponds to a curvilinear distribution of a twelfth function, the twelfth function being $y=\ln x/e^x$; and an eleventh preset proportion distribution satisfied by a content ratio of an element Al to the element H and a twelfth preset proportion distribution satisfied by a content ratio of an element C to an element O of the lower waveguide layer corresponds to a curvilinear distribution of a thirteenth function, respectively, the thirteenth function being a constant function.

6. The semiconductor laser component of claim 1, wherein a current expansion layer is provided between the substrate and the lower limiting layer; the current expansion layer includes at least one of GaN, AlGaN, AlInGaN, AlInN, and AlN, a thickness of the current expansion layer is within a range of 10 Å-5000 Å;

an element Al content distribution of the current expansion layer corresponds to a curvilinear distribution in a third quadrant of a twenty-third function, the twenty-third function being $y=\sin x/x^2$;

a Si doping concentration distribution of the current expansion layer corresponds to a curvilinear distribution of a quadratic function, a quadratic coefficient of the quadratic function being less than 0;

a Si doping concentration distribution of the substrate corresponds to a curvilinear distribution of a twenty-fourth function, the twenty-fourth function being $y=\sin|x|$;

an element C content distribution, an element O content distribution, and an element H content distribution of the current expansion layer respectively correspond to a curvilinear distribution of a twenty-fifth function, the twenty-fifth function being y=arccotx;

the Al element content distribution of the current expansion layer presents a downward trend in a direction towards the substrate, a descent angle being α2, and 45°≤α2≤90°;

the Si doping concentration distribution presents a downward trend in the direction towards the substrate, a descent angle being denoted as β2, and 40°≤β2≤85°;

the H element content distribution presents a downward trend in the direction towards the substrate, a descent angle being denoted as γ2, and 30°≤γ2≤75°;

the O element content distribution presents a downward trend in the direction towards the substrate, a descent angle being denoted as θ2, and 40°≤θ2≤85°;

the C element content distribution presents a downward trend in the direction towards the substrate, a descent angle being denoted as φ, and 40°≤φ≤90°; and changing angles of the Al element content distribution, the Si doping concentration distribution, the C element content distribution, the O element content distribution, and the H element content distribution of the current expansion layer have the following relationship: γ2≤θ2≤φ≥β2≤α2.

* * * * *